United States Patent
Ramsagar et al.

(10) Patent No.: US 6,770,813 B1
(45) Date of Patent: Aug. 3, 2004

(54) MOUNTABLE MICROELECTRONIC PACKAGE

(75) Inventors: Prasanna Ramsagar, Southfield, MI (US); Andrew Z. Glovatsky, Plymouth, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 10/439,542

(22) Filed: May 16, 2003

(51) Int. Cl.[7] .................................................. H02G 3/08
(52) U.S. Cl. ...................... 174/52.1; 361/752; 361/809; 361/810; 361/749
(58) Field of Search .................... 174/52.1; 361/807, 361/809, 810, 749, 752

(56) References Cited

U.S. PATENT DOCUMENTS

| 5,250,758 | A |   | 10/1993 | Fjelstad et al. |
|---|---|---|---|---|
| 5,386,431 | A | * | 1/1995 | Tulip .............................. 372/68 |
| 6,118,072 | A | * | 9/2000 | Scott ........................ 174/52.1 |
| 6,169,254 | B1 | * | 1/2001 | Pant et al. .................... 174/254 |
| 6,320,128 | B1 |   | 11/2001 | Glovatsky et al. |
| 6,344,613 | B1 |   | 2/2002 | Kolodziej |
| 6,469,903 | B1 |   | 10/2002 | Kondo |
| 6,486,410 | B1 | * | 11/2002 | Johansson et al. .......... 174/254 |
| 6,528,742 | B2 |   | 3/2003 | Serizawa et al. |
| 2002/0028600 | A1 |   | 3/2002 | Kondo |
| 2002/0033273 | A1 |   | 3/2002 | Steinhauer |
| 2002/0064031 | A1 |   | 5/2002 | Serizawa et al. |
| 2002/0075660 | A1 |   | 6/2002 | Samant et al. |

* cited by examiner

Primary Examiner—Hung V. Ngo
(74) Attorney, Agent, or Firm—Brinks Hofer Gilson & Lione

(57) ABSTRACT

A microelectronic package includes a flexible substrate and is adapted to be installed onto a support structure, which is preferably a nonplanar support structure. The package includes a frame that is affixed to a perimeter of a first portion of the flexible substrate and forms the substrate into a shape corresponding to the support structure. The package is installed so that the obverse surface of the flexible substrate is intimately against the support structure, so that the support structure not only reinforces the package to prevent damage, but also extracts heat generated during operation of the electronics.

18 Claims, 3 Drawing Sheets

MOUNTABLE MICROELECTRONIC PACKAGE

TECHNICAL FIELD OF THE INVENTION

This invention relates to a microelectronic package comprising a flexible substrate and a frame affixed to the substrate to facilitate installation directly onto a support structure.

BACKGROUND OF THE INVENTION

A microelectronic assembly comprises electronic components and metallic circuit traces disposed on a substrate. In most applications, the substrate is a rigid planar board. Alternately, the substrate may be a flexible polymeric film. One advantage of a flexible substrate is that it may be formed to a non-planar shape. Another advantage is that the substrate may be folded to reduce the footprint in the product. To facilitate manufacture, the substrate is maintained with a planar surface during processing to define the metal traces and attach the electronic components. After the electronic components are-mounted on one surface, the obverse surface is attached to a carrier to prevent damage to the components and the electrical connections which might otherwise occur due to flexing of the substrate during handling and installation into the product. In addition, the carrier is typically formed of metal to serve as a heat sink to extract heat generated by the electronic components and thereby maintain a lower operating temperature for the assembly.

The carrier adds to the size, weight and cost of the assembly. In many applications, the assembly Is then mounted onto a support structure within the product. For example, the assembly may be mounted onto an installation site that is part of the chassis of an automotive vehicle. Under these circumstances, the support structure is able to reinforce the substrate and also to serve as a heat sink. However, access to the installation site may be limited, for example, by other components of the vehicle. Thus, the carrier has been required to allow the package to be manipulated onto the installation site and fastened without damage and within a reasonable time conducive to mass production operations.

Therefore, a need exists for a microelectronic package that comprises a flexible substrate that may be folded and shaped into a desired configuration and readily installed with the obverse surface of the substrate against a support structure in the product, without an intermediate carrier. The package needs to be accurately and quickly positioned and fastened to the support structure without damage to the electronic components or electrical connections and within a time conducive to mass production operations. Elimination of the carrier would reduce the size, weight and expense of the package and utilize the support structure in the product to provide mechanical strength and heat extraction during operation.

BRIEF SUMMARY OF THE INVENTION

In a preferred embodiment, this invention provides a microelectronic package that comprises a flexible substrate that is folded and formed in a desired configuration and mounted directly onto a support structure. The flexible substrate has a first portion, a second portion and a fold therebetween. The first portion includes a first electronics-bearing surface region, a first perimeter about the first surface region and an obverse surface opposite the first region. The second portion has a second electronics-bearing surface region and second perimeter about the second surface region. Electronic components are attached to the first and second surface regions and the flexible substrate is folded at the fold to arrange the second surface region to face the first surface region. In accordance with this invention, the microelectronic package includes a frame having a first side affixed to the first perimeter and a second side affixed to the second perimeter. The frame includes one or more holes adapted to receive fasteners for mounting the microelectronic package onto the support structure. It is a feature of this invention that the frame is affixed to the first perimeter of the first portion, so that the obverse surface is free to be mounted directly against the support structure. The frame reinforces the flexible substrate and forms the microelectronic package into a desired configuration to facilitate handling and installation without damage to the electronic components or electrical connections.

BRIEF DESCRIPTION OF THE DRAWINGS

This invention will be further illustrated with reference to the drawings wherein.

DETAILED DESCRIPTION OF THE INVENTION

Figure 1:
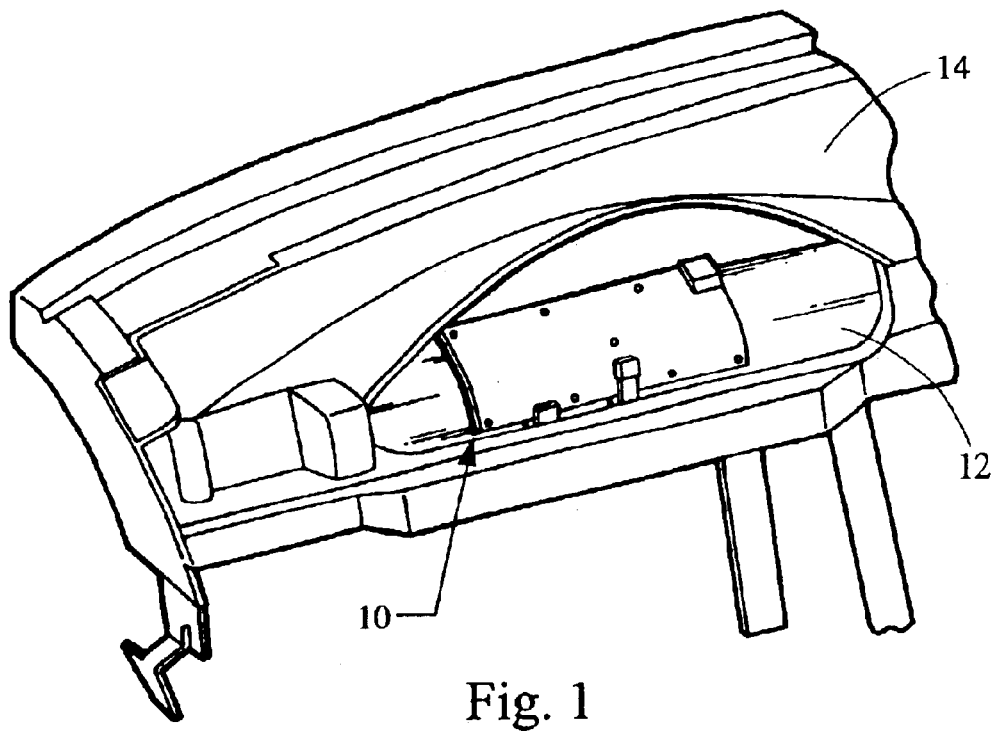
FIG. 1 is a perspective view showing a portion of an automotive vehicle having installed therein a microelectronic package in accordance with the preferred embodiment of this invention.
Figure 2:
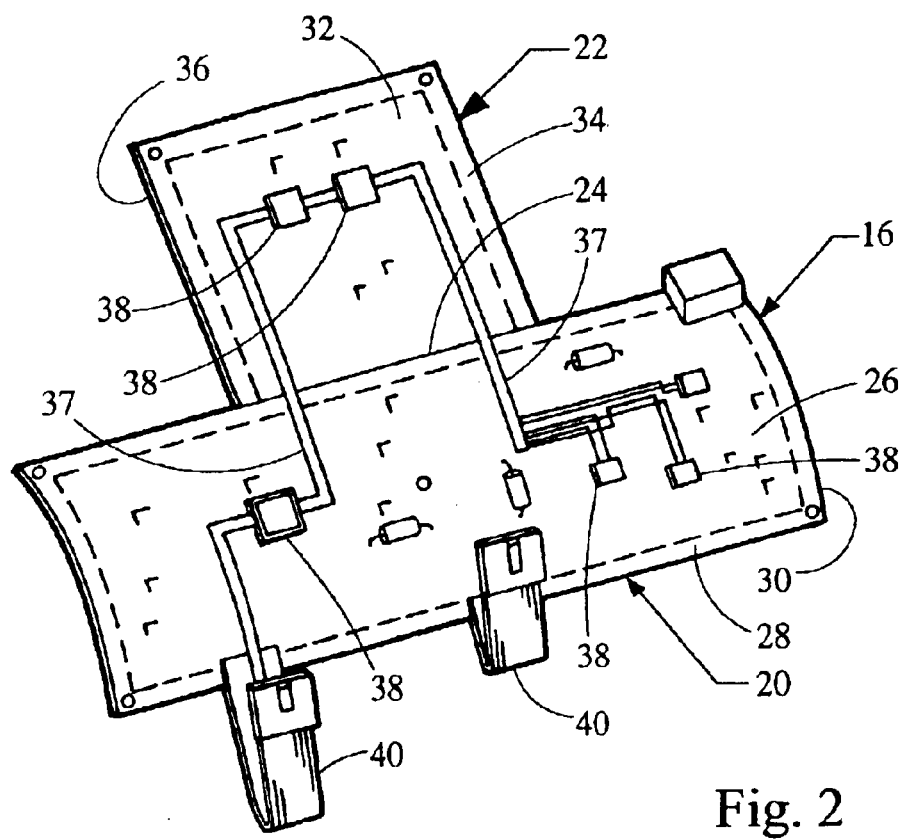
FIGS. 2–3 are perspective views showing elements of the microelectronic package during manufacture.

By way of a preferred example, referring to FIG. 1, this invention provides a microelectronic package 10 adapted to be mounted onto a cylindrical cross beam 12 that is part of a chassis of an automotive vehicle. In this example, package 10 is located adjacent instrument panel 14 and electrically connected to the panel for operating instruments installed therein. It will be appreciated that this description is by way of a preferred example and that the invention may be readily adapted to provide microelectronic packages suitable for other sites onboard an automotive vehicle, or for packages for non-automotive applications.

Referring now to FIGS. 2–6, package 10 comprises, as main elements, a flexible substrate 16 and a frame 18. Substrate 16 is formed of a thin polymeric film and includes a first portion 20 and a flap-like second portion 22 integrally attached at a fold 24. First portion 20 includes a first major surface 26, a first perimeter 28 about region 26, and a first obverse surface 30 opposite region 26. Second portion 22 includes a second major surface region 32, a second perimeter 34 about region 32 and a second obverse surface 36 opposite region 32. Electronic components 38, shown schematically, are mounted onto major surfaces 26 and 32 and interconnected by metallic traces 37, also shown schematically. In this example, electronic components 38 are also applied to second obverse surface 36. Traces 37 overlie regions 26 and 32 and also extend across fold 24 to connect components on first portion 20 and components on second portion 22. Substrate 16 also include connector strips 40 that extend from first portion 20 for making external connections to the circuit on package 10.

Figure 4:
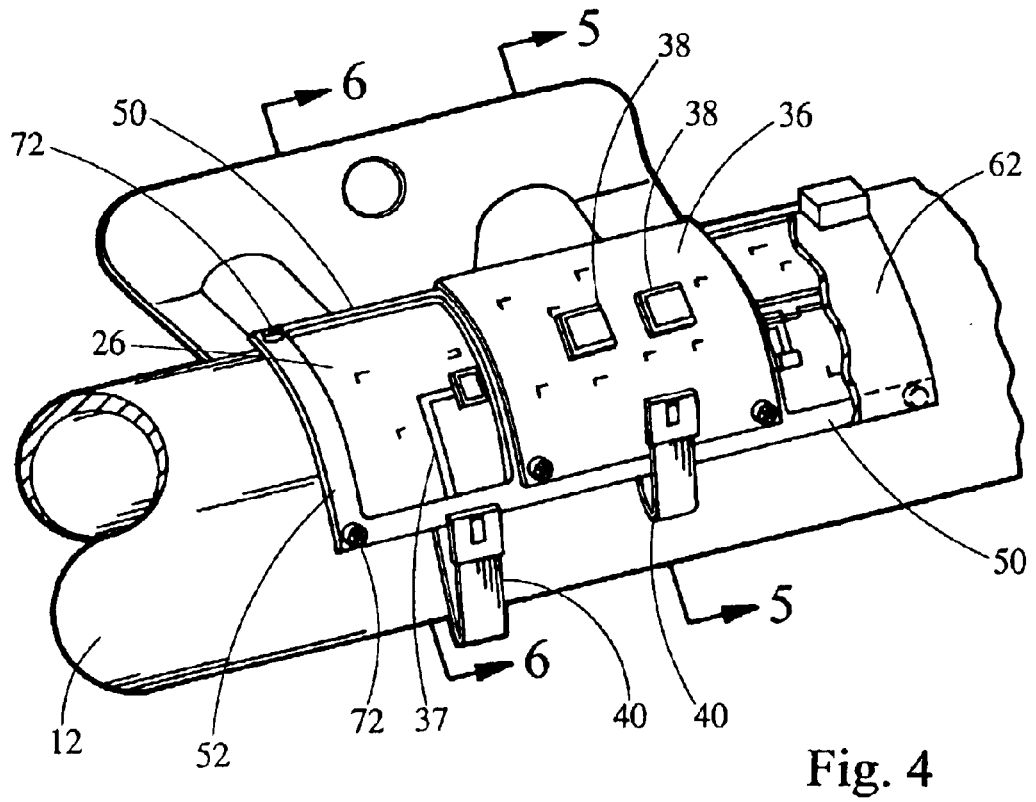
FIG. 4 is a perspective view showing the microelectronic package as manufactured and installed.
Figure 5:
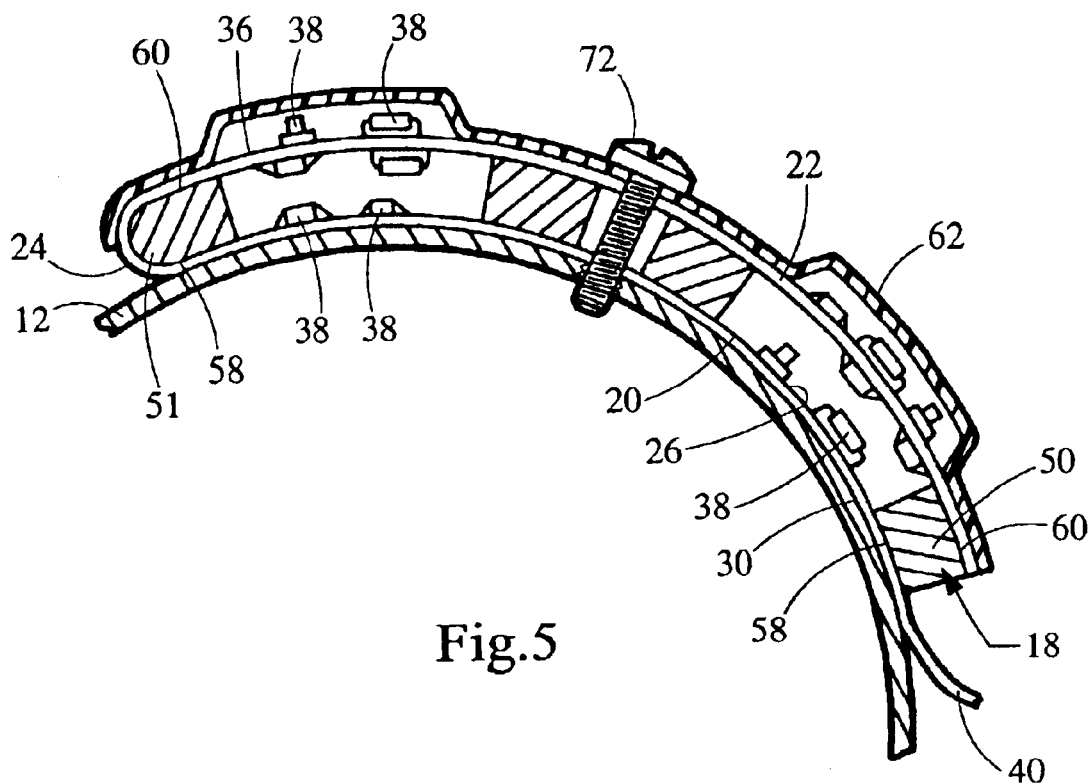
FIG. 5 is a cross sectional of the microelectronic package in FIG. 4, taken along line 5—5.
Figure 6:
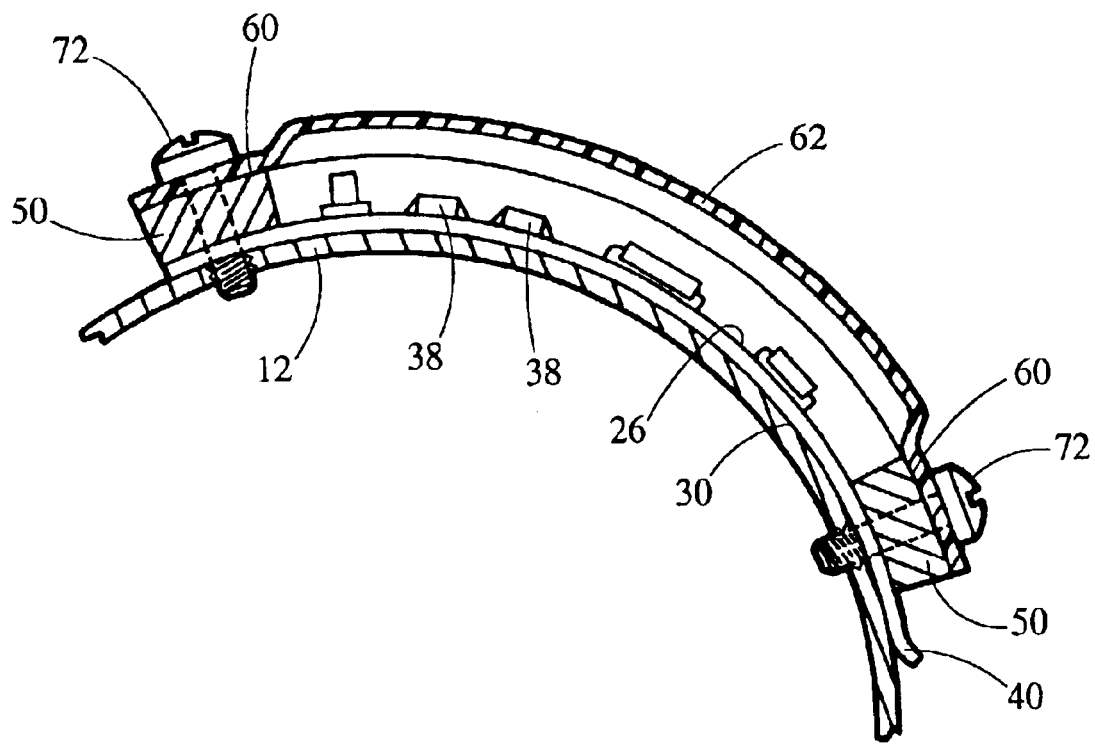
FIG. 6 is a cross sectional view of the microelectronic package in FIG. 4, taken along line 6—6.

Frame 18 includes strips 50 attached to longitudinal edges of portion 20 parallel to fold 24. Strip 50 includes a section 51 adjacent fold 24 and having rounded periphery to define a desired radius for fold 24, as shown in FIG. 4. Frame 18 further includes an end strip 52 and strips 54 that connect strips 50 and extend generally perpendicular thereto. Ribs 55 extend in an X-shape between intersections of strips 54 and strips 50 for additional reinforcement. A first side 58 of frame 18 is adhesively bonded to first perimeter 28. Also, strips 54 and ribs 56 are adhesively bonded to region 26 but are located apart from the electronic components mounted thereto. Second perimeter 34 of second portion 22 is adhesively bonded to a second side 60 of frame 18 at section 51, strips 54, and a portion of longitudinal strip 50 opposite section 51, as shown in FIGS. 4 and 5. Frame 18 is preferably formed of polymeric material and is a self-sustaining structure that is sized and shaped to conform to the installation site, which is a portion of a cylindrical beam 12 in this embodiment. Accordingly, strips 52 and 54 are curved in a radius corresponding to the beam, so that, when substrate 16 is attached to frame 18, the frame forms the substrate into a partial cylinder configuration that conform to the installation site. This allows the package to be readily and accurately positioned on the beam. Also, fold 24 is parallel to the axis of curvature, i.e., the axis of the cylindrical beam, thereby providing a straight line to facilitate folding of the substrate without damage.

A cover 62 is adhesively bonded to second side 60 of frame 18 and second obverse surface 36. Holes 70 are provided in the frame for receiving attachment screws 72 for installation, which also extend through substrate 16 and cover 62. While package 10 is attached to cross beam 12 using screws 72 in the described embodiment, the package may be attached by other suitable fasteners including rivets, brads, and press fit pins.

Figure 3:
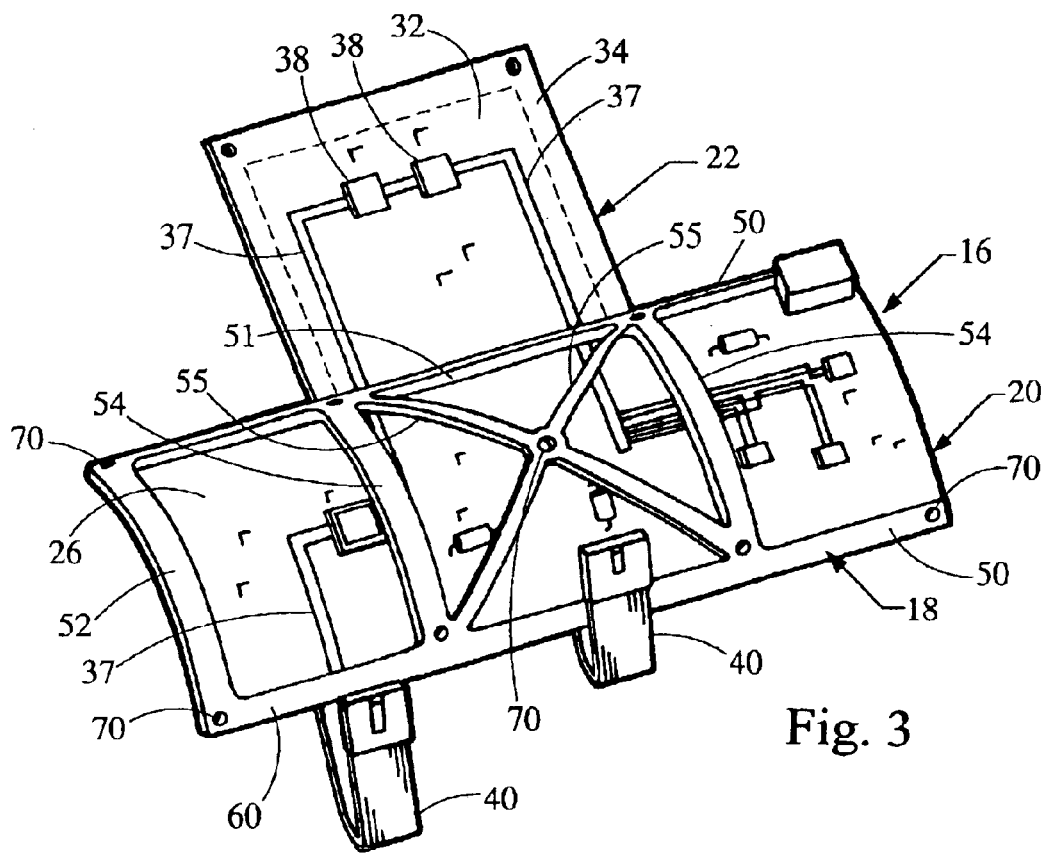

Microelectronic package 10 is preferably manufactured from commercially available polymeric film that includes metallic films applied to the major surfaces thereof. The sheet material is cut into the shape of substrate 16 including portions 20 and 22. Substrate 16 is fixtured in a plane and processed to remove unwanted metal from the surfaces and thereby define the circuit traces 37. While continuing to maintain substrate 16 planar, electronic components 38 are mounted onto surfaces 26, 32 and 36. Frame 18 is then attached to first portion 20 to adhesively bond first side 58 to first perimeter 28, as shown in FIG. 3. Thereafter, second portion 22 is folded at fold 24 about the outer periphery of section 51, and second perimeter 34 is adhesively affixed to second side 60 of the frame. The self-sustaining frame forms the flexible substrate into the desired shape for the package, which is partial cylindrical shape in this embodiment. Thereafter, cover 62 is adhesively bonded to frame second adverse face 36 to complete the package. Cover 62 is preferably also a self-sustaining structure to reinforce the package in the desired shape.

It is a principle advantage of the preferred microelectronic package 10 that it may be readily installed onto the cross beam 12 during assembly of the automotive vehicle. Frame 18, and also cover 62, provides reinforcement for substrate 16 to permit the package to be maneuvered onto the installation site on cross beam 12 without damage to the electronic components or the electrical connections. The package is readily positioned onto the installation site with obverse surface 30 against cross beam 12, and screws 72 inserted through holes 70 to fasten the package in position. A layer of thermal grease or thermal adhesive may be applied between obverse surface 30 and cross beam 12 to reinforce the attachment and enhance thermal transfer between the flexible substrate and the support structure. Thereafter, connector strips 40 are connected to wiring within the vehicle to complete installation.

Therefore, this invention provides a microelectronic package that includes a flexible substrate that may be folded and formed into a desired configuration and installed into a product, such as an automotive chassis, without requiring a carrier affixed to the obverse surface. By eliminating the carrier, this invention reduces the size, weight and cost of the product assembly. The microelectronic packages comprises a frame that is affixed to the flexible substrate apart from the electronic components. Moreover, the frame is attached to the perimeter of the major portions to physically reinforce the flexible substrate and prevent excessive bending that might damage the electronics. In addition, the frame forms the flexible substrate, and thus the package, into a desired configuration to facilitate installation into a product. The package may include a cover to further protect the electronic features and reinforce the package in the desired shape. This invention is particularly useful for forming packages that included folded portions and non-planar configurations, thereby permitting optimum use of the major advantages of flexible circuits. This is accomplished without encumbering the obverse surface that is installed intimately against the support structure for further reinforcement and heat extraction. Thus, the microelectronic package makes maximum sure of the support structure to reinforce the flexible substrate and to extract heat during operation.

While this invention has been described in terms of certain embodiments thereof, it is not intended to be so limited, but rather only to the extent set forth in the claim that follow.

What is claimed is:

1. A microelectronic package adapted to be fastened onto a support structure, said microelectronic assembly comprising:
   a flexible substrate having a first portion, a second portion and a fold therebetween, said first portion having a first electronics-bearing surface region, a first perimeter about said first electronics-bearing surface region and an obverse surface opposite said first electronics-bearing surface region, said second portion having a second electronics-bearing surface region and a second perimeter about said second electronics-bearing surface region, wherein said flexible substrate is folded at said fold such that the second electronics-bearing surface region faces the first electronics-bearing surface region;
   electronic components attached to said first and second electronics-bearing surface regions; and
   a frame having a first side affixed to the first perimeter and a second side affixed to the second perimeter and comprising at least one hole for receiving a fastener for fastening the microelectronic package to a support structure such that the first obverse surface is adjacent the support structure.

2. A microelectronic package in accordance with claim 1 comprising a conductive trace overlying said fold to interconnect electronic components on said first electronics-bearing surface region and said second electronics-bearing surface region.

3. A microelectronic package in accordance with claim 1 wherein the frame has a self-sustaining, nonplanar shape.

4. A microelectronic package in accordance with claim 3 wherein the frame forms the first portion in a shape corresponding to a partial surface of a cylinder having an axis parallel to the fold.

5. A microelectronic package in accordance with claim 1 further comprising a cover attached to said flexible substrate and said frame.

6. A microelectronic package in accordance with claim 1 wherein the cover has a self-sustaining, nonplanar shape.

7. A microelectronic package in accordance with claim 1 wherein the section includes a curved outer surface adjacent the fold.

8. A microelectronic package in accordance with claim 1 wherein the microelectronic package is adapted to be mounted onto a nonplanar support within a chassis of an automotive vehicle.

9. A microelectronic package in accordance with claim 1 wherein the microelectronic package is adapted to be mounted on a cylindrical beam.

10. A microelectronic package in accordance with claim 1 wherein the flexible substrate comprises strips extending from said first portion and adapted for connecting said electronic components to an external electrical circuit.

11. A microelectronic package in accordance with claim 1 wherein the fastener is a screw.

12. A microelectronic package in accordance with claim 1 further comprising a cover attached to said flexible substrate and said frame.

13. A microelectronic package fastened to said installation site, said microelectronic assembly comprising:

a flexible substrate having a first portion, a second portion and a fold therebetween, said first portion having a first electronics-bearing surface region, a first perimeter about said first electronics-bearing surface region and an obverse surface opposite said first electronics-bearing surface region, said second portion having a second electronics-bearing surface region and a second perimeter about said second electronics-bearing surface region, wherein said flexible substrate is folded at said fold such that the second electronics-bearing surface region faces the first electronics-bearing surface region;

electronic components attached to said first and second electronics-bearing surface regions;

a frame having a first side affixed to the first perimeter and a second side affixed to the second perimeter, and at least one fastener fastening the microelectronic package to a installation site such that the first obverse surface is adjacent the support structure.

14. A microelectronic package in accordance with claim 13 wherein the installation site is nonplanar, and wherein the frame is a self-sustaining structure forming the first portion in a nonplanar shape corresponding to the installation site.

15. A microelectronic package in accordance with claim 14 wherein the installation site is a cylindrical beam.

16. A microelectronic package in accordance with claim 13 comprising a conductive trace overlying said fold to interconnect electronic components on said first electronics-bearing surface region and said second electronics-bearing surface region.

17. A microelectronic package in accordance with claim 13 wherein the microelectronic package is adapted to be mounted onto a nonplanar support within a chassis of an automotive vehicle.

18. A microelectronic package in accordance with claim 13 wherein the fastener is screw.

* * * * *

UNITED STATES PATENT AND TRADEMARK OFFICE
CERTIFICATE OF CORRECTION

PATENT NO. : 6,770,813 B1
DATED : August 3, 2004
INVENTOR(S) : Prasanna Ramsagar et al.

It is certified that error appears in the above-identified patent and that said Letters Patent is hereby corrected as shown below:

<u>Column 6,</u>
Line 11, immediately after "second perimeter" delete "," (comma) and substitute -- ; -- (semicolon) in its place.
Lines 11-12, start a new paragraph with "at least one fastener".

Signed and Sealed this

Seventh Day of December, 2004

JON W. DUDAS
*Director of the United States Patent and Trademark Office*